United States Patent
Hinton et al.

(10) Patent No.: US 11,486,056 B2
(45) Date of Patent: Nov. 1, 2022

(54) LOW WORK FUNCTION MATERIALS

(71) Applicant: Borealis Technical Limited, North Plains, OR (US)

(72) Inventors: Michael J. Hinton, Gahanna, OH (US); Joseph M. Fine, West Caldwell, NJ (US); Peter Vanderwicken, Carversville, PA (US); Jonathan S. Edelson, Springfield, MA (US); John D. Birge, Odessa, WA (US)

(73) Assignee: Borealis Technical Limited, Isle of Man (IM)

( * ) Notice: Subject to any disclaimer, the term of this patent is extended or adjusted under 35 U.S.C. 154(b) by 195 days.

(21) Appl. No.: 16/791,077

(22) Filed: Feb. 14, 2020

(65) Prior Publication Data

US 2020/0263322 A1 Aug. 20, 2020

Related U.S. Application Data

(60) Provisional application No. 62/805,901, filed on Feb. 14, 2019.

(51) Int. Cl.
*C30B 33/08* (2006.01)
*C30B 33/00* (2006.01)
(Continued)

(52) U.S. Cl.
CPC .......... *C30B 33/005* (2013.01); *C30B 29/60* (2013.01); *C30B 33/08* (2013.01); *B82Y 10/00* (2013.01)

(58) Field of Classification Search
CPC ....... C30B 33/005; C30B 33/08; C30B 29/60; B82Y 10/00
See application file for complete search history.

(56) References Cited

U.S. PATENT DOCUMENTS 6,117,344 A 9/2000 Cox
7,649,172 B2 * 1/2010 Ozawa ................. H01J 37/28
250/306

(Continued)

FOREIGN PATENT DOCUMENTS

WO WO03/083177 A2 9/2003

OTHER PUBLICATIONS

Tavkhelidze et al., Observation of new quantum interference effect in solids (2005) https://www.researchgate.net/publication/4235925_Observation_of_new_quantum_interference_effect_in_solids.

(Continued)

*Primary Examiner* — Robert M Kunemund

(57) ABSTRACT

Reduced and low work function materials capable of optimizing electron emission performance in a range of vacuum and nanoscale electronic devices and processes and a method for reducing work function and producing reduced and low work function materials are described. The reduced and low work function materials advantageously may be made from single crystal materials, preferably metals, and from amorphous materials with optimal thicknesses for the (Continued)

materials. A surface geometry is created that may significantly reduce work function and produce a reduced or low work function for the material. It is anticipated that low and ultra-low work function materials may be produced by the present invention and that these materials will have particular utility in the optimization of electron emissions in a wide range of vacuum microelectronics and other nanoscale electronics and processes.

14 Claims, 4 Drawing Sheets

(51) Int. Cl.
   *C30B 29/60* (2006.01)
   *B82Y 10/00* (2011.01)

(56) References Cited

U.S. PATENT DOCUMENTS

| | | | |
|---|---|---|---|
| 2003/0173338 A1* | 9/2003 | Vallance | H01J 37/3056 219/121.2 |
| 2005/0147841 A1 | 7/2005 | Tavkhelidze | |
| 2006/0068611 A1* | 3/2006 | Weaver | H01J 45/00 439/65 |
| 2009/0079297 A1* | 3/2009 | Walitzki | H01J 45/00 310/306 |
| 2009/0127549 A1* | 5/2009 | Walitzki | H01J 45/00 257/43 |
| 2015/0093583 A1 | 4/2015 | Hosono et al. | |
| 2015/0128848 A1 | 5/2015 | Zhao et al. | |
| 2016/0111263 A1* | 4/2016 | Ito | H01J 37/3423 204/192.15 |
| 2017/0213611 A1* | 7/2017 | Cox | G21G 1/02 |

OTHER PUBLICATIONS

Gold nanoparticles with molecules make new electronic properties arise www.insp.jussieu.fr/Gold-nanoparticles-with-molecules.
J-S Huang et al., Atomically flat single-crystal gold nanostructures for plasmonic nanocircuitry (2010) https://www.nature.com/articles/ncomms1143.
H. Hosono et al., Transparent amorphous oxide semiconductors for organic electronics: Application to inverted OLEDs (2016) https://www.pnas.org/content/pnas/114/2/233.full.pdf.
Y. Wan et al., The relationship of surface roughness and work function of pure silver by numerical modeling (2012) http://www.electrochemsci.org/papers/vol7/7065204.pdf.
M.K. Kristosov et al., Sponge-like nanporous single crystals of gold (2015) https://www.nature.com/articles/ncomms9841.
R.T. Howe et al., Using first-principles simulations to discover materials with ultra-low work functions for energy conversion applications (2013) https://gcep.stanford.edu/pdfs/techreports2014/2.7.2_Howe_Sponsor_and_Public_Version.pdf.
A Tavhelidze, et al. "Observation of quantum interference effect in solids." Journal of Vacuum Science & Technology B: Microelectronics and Nanometer Structures Processing, Measurement, and Phenomena, vol. 24, No. 3, 2006, American Vacuum Society, USA (pp. 1413-1416, whole document, especially figure 3 and sections 2-3); [Attached 4-page article, under the above title, retrieved from https://www.researchgate.net/publication/4235925 on Mar. 19, 2020].

* cited by examiner

LOW WORK FUNCTION MATERIALS

TECHNICAL FIELD

The present invention relates generally to low work function materials useful in vacuum microelectronics and in other nano-level materials applications and specifically to low and ultra-low work function materials made from films with patterned surfaces.

BACKGROUND OF THE INVENTION

Work function is an intrinsic property of a material that may control many other fundamental properties of the material. It may help describe how electrons flow through materials, for example in electrical circuits and catalytic processes. Work function, sometimes referred to as electron work function, is the minimum thermodynamic work or energy required to move electrons from Fermi level inside a solid material to an outside point, usually in a vacuum, near the material surface. The work function of a material may be determined by its composition and by the charge redistribution caused by a dipole layer on the surface of the material. Work function largely reflects the electron behavior of materials and may be influenced by surface conditions, including adsorption, contamination, surface roughness and corrosion. Although the work function may be influenced by a material's surface condition, it also reflects internal atomic interactions and may be directly related to bulk properties of the material, including doping, defects, and/or nanopores. Consequently, the work function parameter may then be used to predict and evaluate mechanical and other properties of metals and other materials, including electron emission. Electron work function may be valuable not only for in-depth understanding of materials but also for developing alternative or supplementary approaches to material design. Work function may also be an important parameter in vacuum microelectronics and other nanoelectronics and nanoscale applications, for example in thermionic devices, solid state electronics, and the like. Additional nanoscale materials applications in which reduction of work function may improve material function include catalysis and topological insulation. Ongoing research may identify a broader range of potential applications in which work function reduction produces beneficial effects on materials used in the foregoing and other areas.

The work function W for a given surface of a material is generally defined by:

$$W = -e\phi - E_F,$$

where $-e$ is the charge of an electron, $\phi$ is the electrostatic potential in a vacuum near the material surface, and $E_F$ is the Fermi level or electrochemical potential of electrons inside the material. $-e\phi$ represents the energy of an electron at rest in the vacuum near the surface of the material. The Fermi level may be directly controlled by voltage applied to the material, typically through electrodes, and work function may be a fixed characteristic of the surface of the material.

Reducing work function below the established work function values for a material has been found to be critical for electron and electronic conversion and electron emission applications. Low work function materials, especially low work function thin films, may enable electronic devices to produce high efficiency electron emissions required for optimal function of these devices. One approach to reducing the work function is to use the wave properties of electrons in the material with energies below the Fermi level to change the electronic structure of a solid. This approach introduces periodic indents in a flat surface of the solid to change the geometry of the surface and thereby reduce the available quantum states of electrons in the material, which increases the Fermi level and correspondingly reduces the work function. While this approach has produced some reduction in work function, a larger work function reduction than has been presently achieved is expected to provide further improvements in functions of vacuum microelectronic and other nanoscale devices, materials, and processes. Another approach that may further increase the Fermi level and reduce the work function uses indents in the form of zig-zag, honeycomb, or nanopore patterning of a surface, which may be combined with periodic linear indents.

To increase tunneling and thermionic emissions of electrons in vacuum microelectronic devices, such as gap diode devices, it has been suggested that achieving a work function of 1.0 eV or less on an active portion of the device may be necessary for optimal performance. Actually reducing work function to 1.0 eV in materials useful as components for the foregoing and other vacuum microelectronic devices, however, has presented challenges. A need exists for low work function and ultra-low work function materials that will optimize electron emission performance in a range of vacuum microelectronic and other nanoscale electronic devices and processes and for a method for producing such low and ultra-low work function materials useful in these devices.

SUMMARY OF THE INVENTION

It is a primary object of the present invention, therefore, to provide low work function and ultra-low work function materials capable of optimizing electron emission performance in a range of vacuum and other nanoscale electronic devices and nanoscale processes.

It is another object of the present invention to provide a method for reducing work function to produce low work function and ultra-low work function materials capable of optimizing electron emission performance in a range of vacuum and other nanoscale electronic devices and nanoscale processes.

It is an additional object of the present invention to provide low and ultra-low work function materials capable of functioning optimally at a wide range of applied current for vacuum microelectronic devices.

It is a further object of the present invention to provide single crystal and amorphous materials with an ultra-low work function.

It is yet a further object of the present invention to provide a single crystal gold film with an ultra-low work function.

In accordance with the aforesaid objects, low work function and ultra-low work function materials capable of optimizing electron emission performance in a range of vacuum and nanoscale electronic devices and processes and a method for reducing work function and producing such ultra-low work function materials are provided. The low work function and ultra-low work function materials advantageously may be made from single crystal materials, preferably metals, and from amorphous materials with optimal thicknesses for the materials. A surface geometry is created that may significantly reduce work function and produce a low or an ultra-low work function for the material. It is anticipated that the low and ultra-low work function materials of the present invention will have particular utility in the optimization of electron emissions in a wide range of vacuum microelectronics and other nanoscale electronics and processes.

Other objects and advantages will be apparent from the following description, claims, and drawings.

DESCRIPTION OF THE INVENTION

Figure 1:
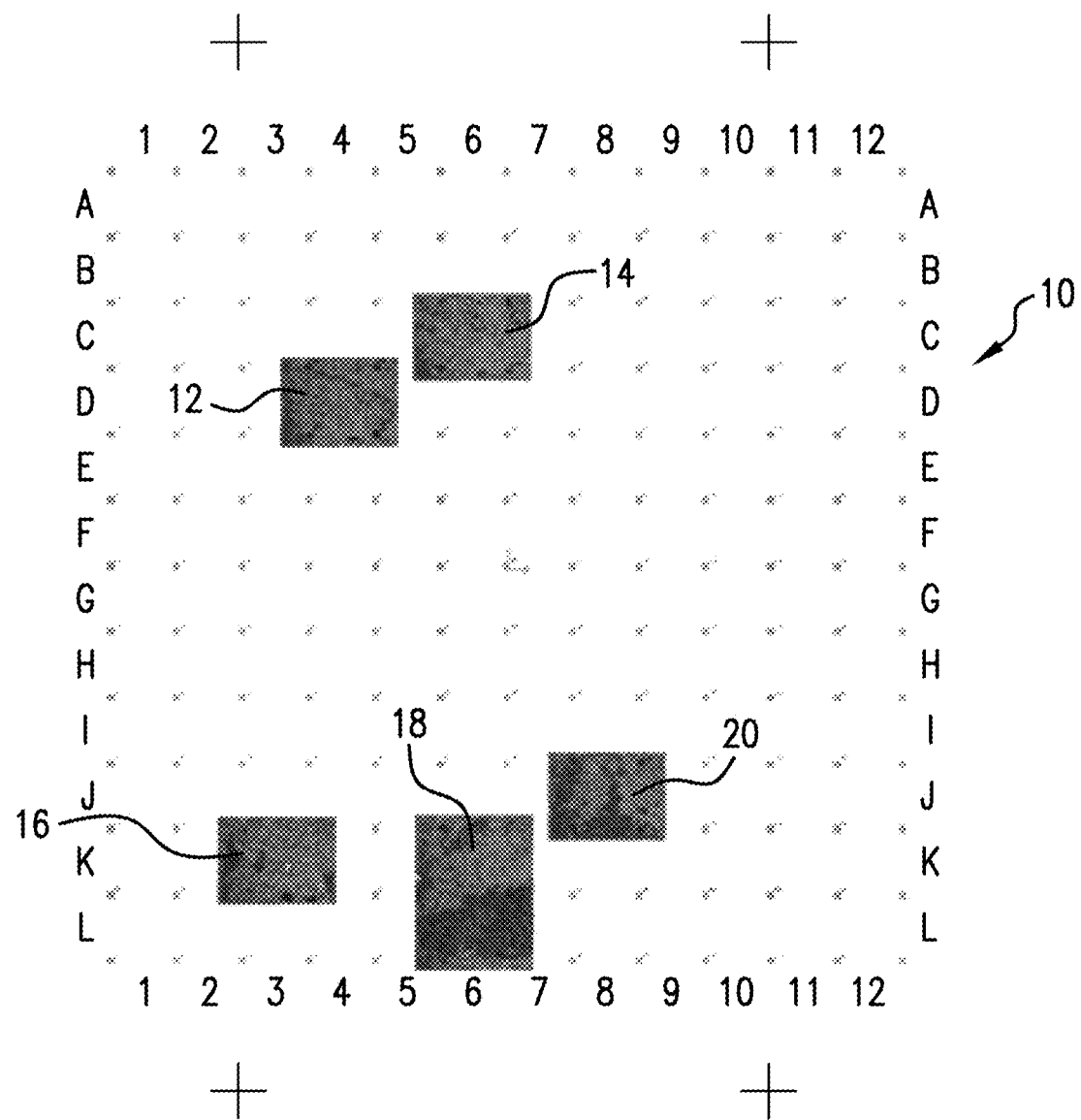
FIG. 1 is a diagram of a chip showing locations of work function measurements on a number of single crystal gold flakes supported on a substrate and having a surface pattern as described herein in accordance with the present invention.

Theoretically, reducing work function to the ultra-low level required to optimize electron emissions, particularly in materials identified as useful in vacuum microelectronics and other nanoscale materials and process applications, is achievable. However, as noted above, actually reducing the work function in such materials to such ultra-low levels presents challenges. The inventors of the present invention have achieved a significant reduction in work function to a level not previously achieved in these materials.

As used herein, the term "reduced work function material" refers to a material in which the work function value of the material has been reduced in accordance with the present invention to a work function value not previously known or achieved. The term "low work function materials" is used to refer to materials with work function values in the range of about 3.0 eV or less. The term "ultra-low work function materials" refers to materials with work function values of about 1.0 eV and less. Materials that have work function values in the 0.5 to 1.0 eV range and are stable at elevated temperatures in low vacuum environments may increase the efficiency of thermionic devices, including energy converters and similar devices. Efficiency improvements may also be achieved in nanoscale insulators and catalysts made from low work function and ultra-low work function materials according to the present invention. As noted above, additional applications for the present low and ultra-low work function materials are contemplated.

Work function values have been determined for a number of elements and for materials used in vacuum microelectronics and other nanoscale devices and processes. Since work function depends on configurations of atoms at material surfaces, work function may vary, for example on different crystal faces, and may be expressed as a range of values. Work function values for silver and gold may range from about 4.26 to 4.74 eV for silver and from about 5.10 to 5.47 eV for gold. Materials useful in vacuum microelectronics or nanoelectronic applications that may be candidates for work function reduction are typically metallic elements, including silver and gold. Other materials that may also be useful in vacuum microelectronic and other nanoscale applications include metallic alloys, such as $TiAl_3$ (also known as bulk metallic glass), intermetallic alloys, such as $CaAl_4$ and $BaAuIn_3$, and electrides, such as C12A7 ($12CaO.7Al_2O_3$). The foregoing materials may additionally be candidates for work function reduction as described herein. These examples are not intended to be limiting, however, and it is anticipated that the work function values of additional individual materials and classes of materials may be reduced to produce low work function and ultra-low work function materials as described herein.

The low work function and ultra-low work function materials produced in accordance with the present invention may be made from amorphous, polycrystalline, or single crystal metals and other materials, including those listed above. Single crystal and amorphous materials, however, may demonstrate a greater degree of work function reduction. The lack of grain boundaries in single crystal and amorphous materials makes these materials preferred candidates for work function reduction in accordance with method described herein. Grain boundaries may interfere with work function reduction. Polycrystalline materials in which the crystal domains are large compared to the patterning applied to the material as described herein may also be suitable for work function reduction.

It has been observed in materials with a small grain size, in which the grains act like quantum boxes, that the presence of these small grains may raise the Fermi energy of the material, and this reduces the material's work function. The low and ultra-low work function materials of the present invention are most advantageously made from single crystal metals that may be grown atomically smooth and may be in the form of a film deposited on a suitable substrate. The substrate selected may depend on the specific thermionic or other application in which the low work function material is to be used.

It has been recognized that changing the surface geometry of a film formed from a metal or other material useful in thermionic and like devices may produce a change in the work function of the film. One way in which the surface geometry of a film may be changed is to introduce a pattern into or on the film surface. A pattern, described as Avto patterning, creates a series of periodic indents in the surface of a metal film that may reduce work function of the metal film and produces what is described as the Avto Effect. The Avto Effect is based on the quantum interference that results when two parallel flat metallic surfaces are separated by a gap, which is a distance less than the deBroglie wavelength of an electron for some electron energies. The electrons in atoms near the surface of a metal film with lower energy levels have longer wavelengths than electrons farther from the surface. The longer wavelengths of the electrons near the surface do not fit into the gap between the parallel flat metallic surfaces. As a result, the electron waves interfere with each other, and electrons with the longer wavelengths are forced to occupy higher energy levels that accommodate electrons with shorter wave lengths.

If treatment of a film, such as by laser irradiation, additive manufacturing, chemical reactions, elevated temperatures, and the like, forms terraces, quantum interference may occur between two electrons in atoms on non-parallel surfaces that join at an angle. The presence of such terraces may contribute to work function reduction. Nano-terraced surfaces or gratings of variable height might be developed so that quantum interference between two electrons can occur not only between atoms on parallel flat surfaces, but also between atoms on non-parallel flat surfaces. The interference may be greatest near changes in the slopes of the two surfaces. Performance may depend on geometry, material composition, surface texture, and operating temperature or electron deBroglie wavelength.

Avto patterning and other surface patterns, including lines and grids, as well as diamond, circular, pyramidal, columnar, and other patterns, and non-periodic indents and patterns, as noted, may reduce work function. Advantageously, the foregoing patterns may also include sharp edges and/or angles to optimize work function reduction. Pyramidal patterns may be in the shapes of three or four-sided pyramidal solids, and surfaces from the base to the top of a pyramid may be stepped to provide multiple sharp edges and/or corners. The presence of multiple sharp edges and corners could increase electron emission activity and lead to work function reduction.

Different techniques may be used to produce a pattern on a flat film surface. The use of focused ion beam (FIB) milling, electron beam lithography, electron beam etching, and similar processes may create patterns having desired widths and depths with the sharp edges and angles that optimize work function reduction. Patterns may also be created by growing structures in patterns on a surface of a flat film. For example, peaks and troughs characterizing a patterned surface may be created on the film flat surface by sputtering, abrasion, and other methods. Alternatively, a substrate may be patterned before a film is deposited on the substrate. The film would then have an outer flat surface opposite the substrate and a patterned surface adjacent to the substrate. The choice of technique or process for producing patterns may depend on the material to be patterned. For example, FIB may produce a higher quality pattern in a single crystal flat metal film that may achieve a greater work function reduction than a pattern produced by electron beam lithography or etching.

Additional methods for producing patterning on a metal film surface may also be employed in accordance with the present invention. For example, focused ion beams may implant oxygen in only selected areas, producing a pattern by selective doping. In this approach, metal is not removed, and the pattern is created by the alternating arrangement of metal/metal-oxide/metal/metal-oxide.

When Avto patterning is used, a pattern resembling a square wave that may have depth dimensions between 5 nanometers (nm) and 50 nm and length dimensions between each mesa and trough between 10 nm and 500 nm may be created, by one of the foregoing techniques, on a film that may have a thickness between 10 nm and 500 nm, although these dimensions may vary, depending on the film material and other considerations.

Surface roughness may have an effect on work function. For example, theoretical calculations based on the size of electron deBroglie wavelengths imply that a surface roughness of about 1.2 nm may limit a work function reduction to about 1.0 eV, while a surface roughness of about 0.6 nm may allow a work function reduction on the order of about 4.0 eV. Using the established work function range for silver described above, a work function reduction on the order of about 4.0 eV may theoretically produce a silver film with an ultra-low work function in the range of about 0.26 to 0.74 eV. This has not been actually achieved, however.

The dimensions of any patterning used on a metal or other film may affect work function reduction. Film thickness may additionally affect potential pattern dimensions and surface roughness. Ideally, a single crystal metal or other film to be patterned will have a continuous smooth surface with as low a work function as possible. A roughness of less than 1.0 nm is preferred, and surface roughness below the nanometer scale down to Angstrom dimensions is most preferred. These dimensions reduce electron scattering, which may be critical to the reduction of work function. For a film to be used in a thermionic device, it is contemplated that surface roughness, whether produced by Avto patterning or another method, should advantageously be about 0.9 nm to optimally reduce work function to at least 1.0 eV. While an optimal film thickness may depend on the specific metal or other material being used, a film having a thickness of 500 nm or less may be effectively patterned to reduce work function.

The reduction in work function that may be produced in a single crystal metal according to the present invention is illustrated by the following discussion and reference to the drawings.

Work function measurements were taken of a number of patterned single crystal gold flakes supported on a fused silica substrate to form a chip measuring about 10×10 mm². The single crystal gold flakes had atomically flat surfaces, with an average surface roughness of about 5 nm, and a thickness of about 200 nm. A 50 nm adhesion layer of $Al_2O_3$ was positioned between the substrate and the single crystal gold flakes. A pattern of gratings having a pitch, or width, of 200 nm and depths from 50 to 70 nm was etched on the single crystal gold flake surfaces opposite the substrate. The chip 10 with the number of patterned single crystal gold flakes, represented at 12, 14, 16, 18, and 20, is shown in FIG. 1. The gratings on the single crystal gold flake 14 and on portions of the single crystal gold flakes 18 and 20 were made by electron beam lithography and electron beam etching, and the gratings on other portions of the single crystal gold flakes 18 and 20 were made by focused ion beam milling (FIB). Surface roughness was determined to be about 5 nm RMS, which indicates a rougher than ideal surface topography. Reducing the surface roughness below this level, optimally significantly below 5 nm, may correspondingly produce significant reductions in work function as the surface smoothness is increased.

Figure 2A:
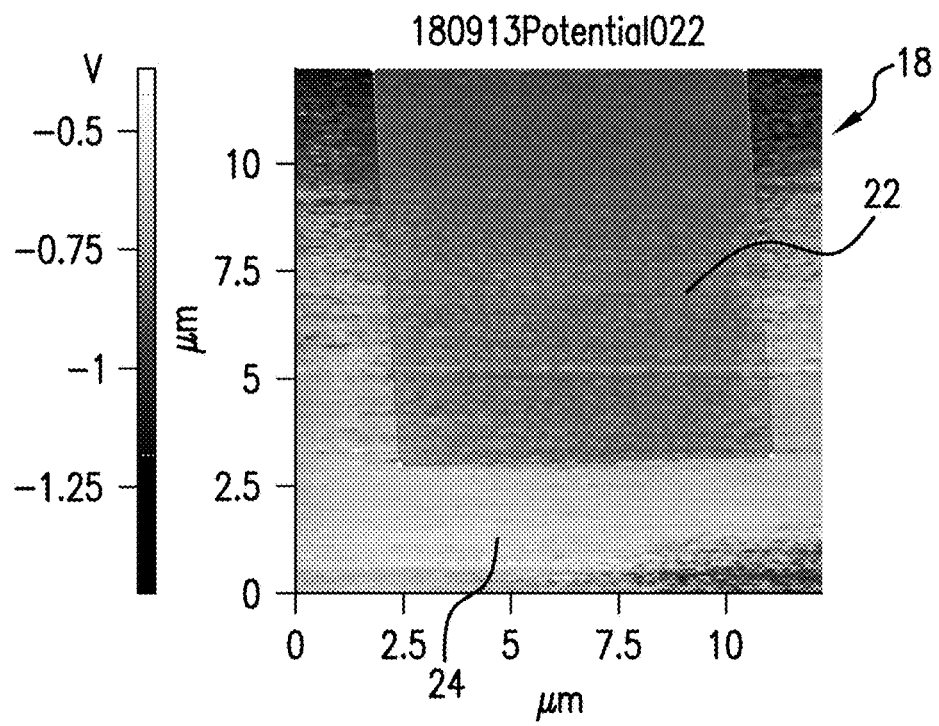
FIG. 2A represents a potential map showing measured work function on one of the number of surface patterned single crystal gold flakes in FIG. 1.
Figure 2B:
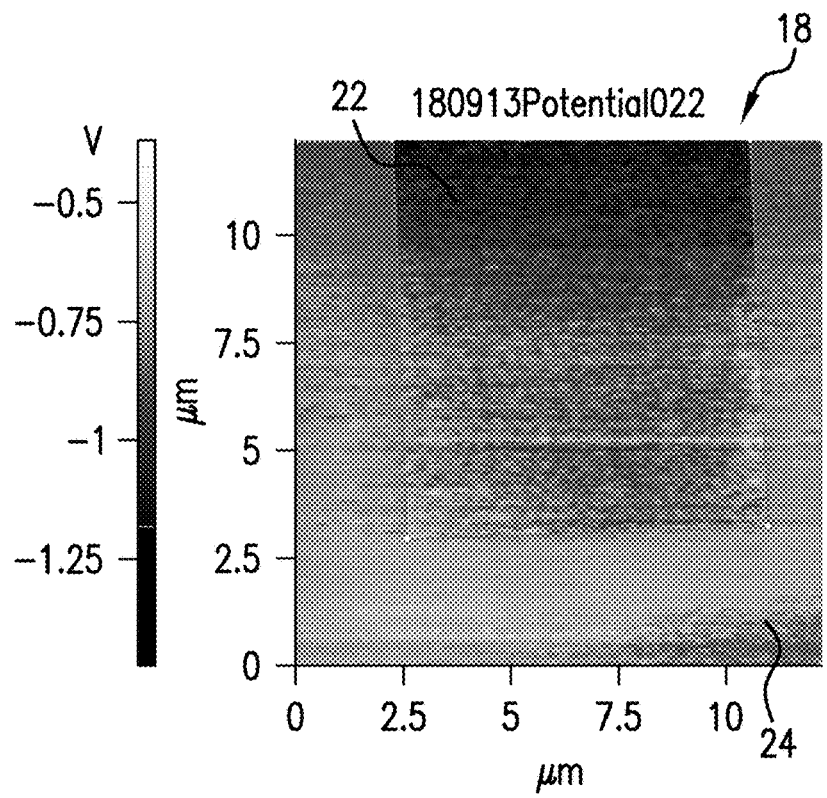
FIG. 2B represents a potential map showing measured work function in unpatterned areas adjacent to the single crystal gold flake of FIG. 2A.

FIGS. 2A and 2B show a portion of the single crystal gold flake 18 and represent specific areas for which work function was determined, respectively, an area 22 inside the patterned grating that has a roughly square shape and an area 24 outside the patterned grating area that surrounds the area 22. Work function was measured by the Kelvin Probe method. The measurement inside the grating area represents the work function below the surface of the single crystal gold flake at a depth of about 60 nm. The measurement of area 24 outside the grating area 22 represents the work function at the surface of the single crystal gold flake 18. The work function of the single crystal gold flake in the grating area 22 at a depth of about 60 nm was determined to be 3.667 eV, and the work function at the surface of the single crystal gold flake in area 24 was determined to be 3.846 eV. A work function measurement in another one of the single crystal gold flakes, shown and described in connection with FIG. 3 below, was determined to be 3.6252 eV. As noted above, gold has an established work function in the range of about 5.10 to 5.47 eV. The patterned single crystal gold flake samples demonstrated work function reductions of about 1.43 eV, 1.25 eV, and 1.47 eV to about 1.8 eV, 1.62 eV, and 1.84 eV below the established range. A lower work function value of about 3.3 eV, a reduction of about 1.8 eV to 2.17 eV below the established work function, was also measured in a sample from another single crystal gold flake (not labeled) on the chip 10.

Figure 3:
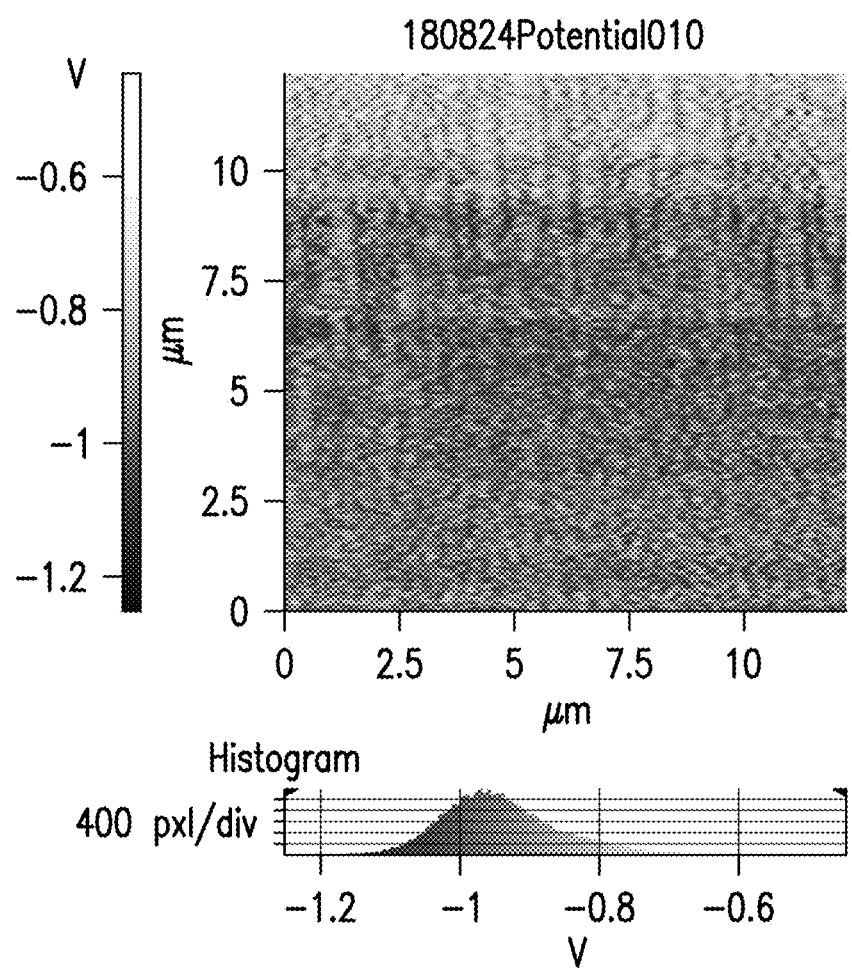
FIG. 3 shows a scanned area of a patterned single crystal gold flake and a corresponding histogram representing the work function of the patterned single crystal gold flake in this area.

FIG. 3 illustrates another sample of a patterned single crystal gold flake from another part of the chip 10 that was scanned and for which work function of the scanned area was measured by the Kelvin Probe method. A histogram representing work function is presented. As stated above, the work function of the scanned area of this single crystal gold flake sample was determined to be about 3.6252 eV, which represents a reduction in work function of about 1.475 eV to about 1.845 eV in this patterned single crystal gold sample.

This level of work function reduction has not previously been obtained in pure gold or without applying an additional substance, such as an organic dipole layer, to a gold surface. Several of the single crystal gold flakes studied that were not clearly patterned had work functions that were consistent with the established work function range for gold, indicating that the patterning applied to the single crystal gold flakes reduced work function to the levels not previously obtained.

It is contemplated that surface conditions may be improved and that additional reductions in work function for the single crystal gold flakes studied may be achieved with different patterning and different patterning dimensions and with reduced surface roughness. It is anticipated that films of single crystal gold with a surface roughness below 5 nm may demonstrate even greater reductions in work function when patterns with optimal dimensions for the film thickness are created in or on the single crystal gold film as described herein. An optimal thickness for single crystal gold films may be 500 nm or less and is preferably on the order of about 200 nm. When a grating type of patterning, which may be a grid pattern, is used, the depth of the grating may be about 200 nm in a 500 nm thick film and proportionately less in a 200 nm thick film. A width of the grating lines may be less than the theoretical minimum of 5 times their depth. Other pattern depths and width dimensions may be appropriate for different materials and material thicknesses.

Figure 4A:
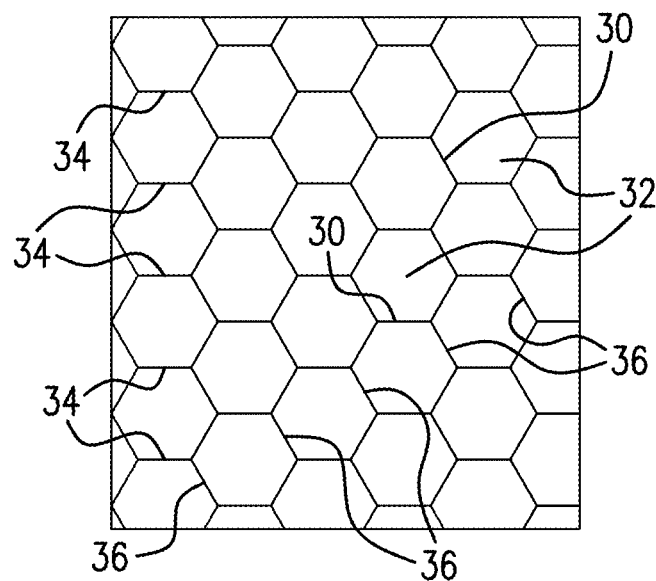
FIG. 4A is an example of a type of patterning that may be used to produce the low work function and ultra-low work function materials of the present invention.
Figure 4B:
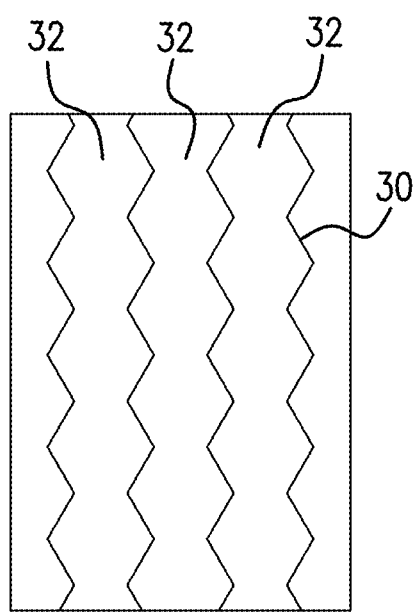
FIGS. 4B and 4C are show modifications of the pattern illustrated in FIG. 4A to produce two different orientations of zig-zag patterns.
Figure 4C:
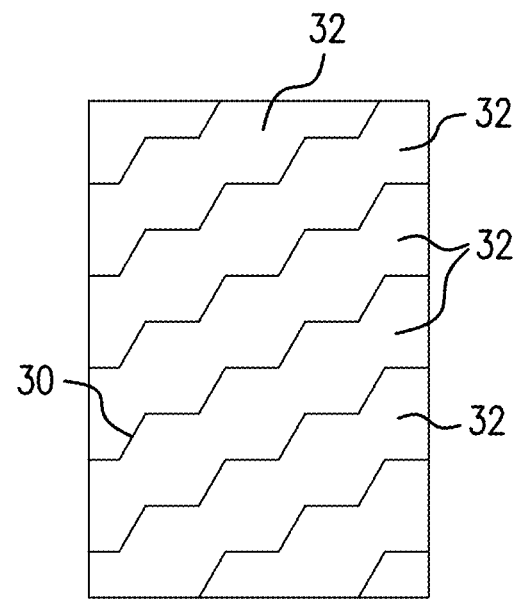

FIGS. 4A, 4B, and 4C illustrate possible pattern geometries and/or configurations that may be applied to produce patterned single crystal gold films and patterned surfaces of other material surfaces, as described herein, to achieve reduction in work function. FIG. 4A shows a hexagon pattern geometry. The dark lines 30 represent indents or trenches in the pattern, and the light areas 32 inside the dark lines 30 represent the surface of the material patterned with the hexagon pattern. If all of the indents or trenches at phase angles of 60, 180, or 240 degrees are omitted or absent, the remaining pattern of indents will be a zig-zag with opposing faces. FIG. 4B illustrates one pattern orientation of zig zags that may be produced when all of the indents or trenches 34 are omitted from the hexagonal pattern of FIG. 4A. The opposing faces produced are oriented parallel to a straight axis. FIG. 4C illustrates a second pattern orientation of zig zags that may be produced when all of the indents or trenches 36 are omitted from the hexagonal pattern of FIG. 4A. The opposing faces produced are oriented diagonally to the axis of the pattern shown in FIG. 4B. Additional orientations of the zig zag pattern (not shown) may also be produced by omitting others of the indents or trenches in the hexagonal pattern geometry of FIG. 4A. As noted above, other patterns, including pyramids, circles, diamonds, and the like, as well as lines and grids, that are periodic and non-periodic may be introduced into material surfaces to change the surface geometry and reduce work function.

It is further contemplated that surfaces of other single crystal metal films, for example silver, and surfaces of the amorphous and other materials described above and/or substrates supporting these materials may be patterned as described to produce reductions in work function in these materials. Depending on the application, such work function reductions may have less value, due to smaller reductions in work function or lower conductivity.

The low and ultra-low work function materials and the method for producing the low and ultra-low work function materials of the present invention have been described with respect to single crystal gold and silver. Advantageously, single crystal gold and silver do not form native oxide layers that may affect work function. It is contemplated that work function may be reduced in single crystal materials with a lower established work function than gold and silver, for example, without limitation, elemental titanium and aluminum. To form low work function and ultra-low work function materials from single crystal titanium, aluminum, or other potential elements, however, oxide formation would need to be prevented or eliminated. Oxide formation may be prevented or eliminated by adding a very thin coating of an anti-oxidizing material, such as scandium, which may be in the form of a scandate.

As noted, the reduced work function materials may be used in a range of nanoscale applications, including, but not limited to, thermionic devices, vacuum microelectronics, nanocatalysts, nanoinsulators, and other devices and process that require optimized emissions of electrons from a surface during operation.

The present invention is further directed to a method for making a reduced work function material that may be a component of one of the foregoing nanoscale applications. The method broadly includes forming an optimal thickness film of a single crystal metal on a substrate, polishing the surface of the film to have a surface roughness of less than 1.0 nm, and forming a desired pattern in or on the smooth film surface having dimensions determined to reduce work function and optimize electron emissions from the film surface. The optimal thickness of the film may depend on factors including the single crystal metal and the particular nanoscale application for the patterned reduced work function product. Alternatively, the desired pattern with the determined dimensions may be created on the single crystal film surface by other methods, including by depositing a suitable material on the film surface or by the other methods referred to above. The film may be formed of materials other than single crystal metals, such as the amorphous, polycrystalline, and electride materials described herein that may be patterned, as described above, with a range of periodic and non-periodic pattern configurations. Additional aspects of the present method, including, but not limited to, temperatures and pressures required to obtain optimal electron emissions in conjunction with patterning the materials forming the films may be factors to be considered in the production of low and ultra-low work function materials. It is contemplated that work function may be reduced significantly below the work function values described herein to produce very low and ultra-low work function materials with the present method.

While the present invention has been described with respect to preferred embodiments, this is not intended to be limiting, and other arrangements and structures that perform the required functions are contemplated to be within the scope of the present invention.

INDUSTRIAL APPLICABILITY

The present invention will find its primary applicability in producing reduced work function, low work function and ultra-low work function materials to optimize electron emissions that have particular utility in nanoscale devices and processes, such as vacuum microelectronics, nanoelectronics, nanoinsulators, nanocatalysis, and the like.

The invention claimed is:

1. A method for reducing work function in a material to a low or ultra-low work function level useful in nanoscale devices and processes, comprising:
   a. forming a film having a thickness of about 500 nm or less comprising a single crystal metal, an amorphous metal, or an electride with a first surface of said film in contact with a substrate and a second flat smooth surface with a surface roughness less than about 1.0 nm opposite said first surface; and
   b. forming a pattern defined to increase electron emissions and reduce work function in the film in at least one patterned area on the second flat smooth surface, wherein the defined pattern comprises a grid, zig-zag lines, hexagons, diamonds, pyramids, or circles having a depth of 200 nm or less and a width about 5 times a depth of the defined pattern, and the defined pattern is formed in the second flat smooth surface by focused ion beam milling, electron beam etching, lithography, or selected doping, further comprising forming the film from single crystal gold metal having a thickness of about 200 nm and a surface roughness of about 0.9 nm on the substrate and forming the defined pattern in the second smooth flat surface of the single crystal gold film to have a depth of about 50 nm to 70 nm.

2. The method of claim 1, further comprising forming the defined patterned area to project above the second flat smooth surface.

3. The method of claim 1, further comprising forming the defined pattern in the in the substrate, then forming the film on the patterned substrate, and omitting the at least one patterned area on the second flat smooth surface.

4. The method of claim 1, further comprising forming the defined pattern of pyramids in the shapes of pyramidal solids having stepped surfaces from a base to a top of each pyramidal solid to provide multiple sharp edges and corners.

5. A method for reducing work function in a material to a low or ultra-low work function level useful in nanoscale devices and processes, comprising:
   a. forming a film having a thickness of about 500 nm or less comprising a single crystal metal with a first surface of said the film in contact with a substrate and a second flat smooth surface having a surface roughness less than about 1.0 nm opposite said the first surface; and
   b. forming a pattern defined to increase electron emissions and reduce work function in the film and creating at least one patterned area on said the second flat smooth surface having the defined pattern, wherein the defined pattern comprises a series of periodic indents, a grid, lines, hexagons, diamonds, pyramids, or circles having sharp edges and a depth of 200 nm or less and a width about 5 times a depth of the defined pattern, and the defined pattern is formed on the second flat smooth surface of the single crystal metal by selective doping, further comprising selectively implanting oxygen in areas of the first second flat smooth surface to form the defined pattern.

6. A method for reducing work function of a single crystal metal in a patterned layered element, comprising
   a. providing a substrate;
   b. providing a single crystal metal selected from the group of single crystal metals comprising gold, silver, titanium, and aluminum;
   c. forming a layer of the single crystal metal with a thickness of 500 nm or less than 500 nm on a surface of the substrate to produce a layered element;
   d. polishing a surface of the single crystal metal layer opposite the substrate to produce a surface roughness of less than 1.0 nm; and
   e. introducing a geometric pattern selected from the group of geometric patterns comprising hexagons, pyramids, diamonds, zig zag lines, a grid, and gratings with a width 5 times a depth of the selected pattern into the polished surface of the single crystal metal layer to a depth of 200 nm in a single crystal metal layer with a thickness of 500 nm and to a depth of less than 200 nm in a single crystal metal layer with a thickness of less than 500 nm, and forming the patterned layered element with a reduced work function in the single crystal metal.

7. The method according to claim 6, further comprising providing a substrate comprising fused silica, providing a single crystal gold metal, forming an adhesion layer of $Al_2O_3$ with a thickness of 50 nm on the substrate, forming the layer of the single crystal gold on the adhesion layer to have a thickness of 200 nm and a surface roughness of 0.9 nm, wherein the selected geometric pattern comprises a grid or gratings, and introducing the grid or gratings pattern to a depth of 50 to 70 nm in the polished surface of the single crystal gold film by focused ion beam milling.

8. The method according to claim 7, wherein the work function of the single crystal gold in the patterned layered element is reduced by about 1.25 eV to 2.17 eV.

9. The method according to claim 6, further comprising forming the layer of the patterned layered element from single crystal silver metal to have a thickness less than 500 nm, introducing the selected geometric pattern to a depth less than 200 nm into the polished surface of the single crystal silver metal layer, and forming the patterned layered element with a reduced work function silver.

10. The method according to claim 6, further comprising forming the layer of the patterned layered element from single crystal aluminum metal to have a thickness less than 500 nm, introducing the selected geometric pattern to a depth less than 200 nm into the polished surface of the single crystal aluminum metal layer, adding a coating of an anti-oxidizing material to the patterned polished surface of the single crystal aluminum layer, and forming the patterned layered element with a reduced work function aluminum.

11. The method according to claim 6, further comprising forming the layer of the patterned layered element from single crystal titanium metal to have a thickness less than 500 nm, introducing the selected geometric pattern to a depth less than 200 nm into the polished surface of the single crystal titanium metal layer, adding a coating of an anti-oxidizing material to the patterned polished surface of the single crystal titanium layer, and forming the patterned layered element with a reduced work function titanium.

12. The method according to claim 6, further comprising introducing the selected geometric pattern into the polished surface of the layer to form nano-terraced surfaces of variable heights.

13. The method according to claim 6, further comprising introducing a selected geometric pattern comprising pyramids in the shapes of pyramidal solids having stepped surfaces to provide multiple sharp edges and corners.

14. The method according to claim 6, further comprising introducing a selected geometric pattern comprising oriented zig-zag lines into the polished surface of the layer, the zig-zag lines being created by omitting lines at selected phase angles from a hexagon pattern.

* * * * *